United States Patent [19]
Martin

[11] Patent Number: 6,118,682
[45] Date of Patent: Sep. 12, 2000

[54] METHOD AND APPARATUS FOR READING MULTIPLE MATCHED ADDRESSES

[75] Inventor: William C. Martin, San Jose, Calif.

[73] Assignee: VLSI Technology, Inc., San Jose, Calif.

[21] Appl. No.: 09/110,872

[22] Filed: Jul. 7, 1998

[51] Int. Cl.[7] .................................................. G11C 15/00
[52] U.S. Cl. ............................................................ 365/49
[58] Field of Search .............................. 365/49, 189.07, 365/189.08

[56] References Cited

U.S. PATENT DOCUMENTS

| | | | |
|---|---|---|---|
| 3,354,436 | 11/1967 | Winder | 365/49 |
| 3,602,899 | 8/1971 | Lindquist | 365/49 |
| 4,670,858 | 6/1987 | Almy | 365/49 |
| 5,036,486 | 7/1991 | Noguchi et al. | 365/49 |
| 5,220,526 | 6/1993 | Giles et al. | 365/49 |
| 5,267,190 | 11/1993 | Easley et al. | 365/49 |
| 5,446,686 | 8/1995 | Bosnyak et al. | 365/49 |
| 5,454,094 | 9/1995 | Montove | 365/49 |
| 5,568,416 | 10/1996 | Kawana et al. | 365/49 |
| 5,828,593 | 10/1998 | Schultz et al. | 365/49 |
| 5,859,791 | 1/1999 | Schultz et al. | 365/49 |
| 5,930,790 | 7/1999 | Law et al. | 365/49 |

FOREIGN PATENT DOCUMENTS 875459  10/1981  Russian Federation .

*Primary Examiner*—Trong Phan
*Attorney, Agent, or Firm*—Burns Doane Swecker & Mathis L.L.P.

[57] ABSTRACT

The present invention is directed to providing a storage device, such as a content addressable memory, which enables multiple matches to be simply and efficiently examined during a multiple match cycle, regardless of the size of the storage device. For example, where two matched entries in a content addressable memory correspond to a search address, exemplary embodiments reduce the task of examining the locations of these matches to processing only two matched addresses as opposed to having to match all entries of the content addressable memory. By providing an efficient access to multiple matched entries of a memory, the multiple matches can actually be used in an ordered manner to access different branches of a secondary memory. The use of a relatively simple control scheme enables the control logic to be implemented on a single integrated circuit chip with the memory device itself (e.g., a content addressable memory). Moreover, in contrast to conventional content addressable memories, exemplary embodiments of the present invention enable the user to reset an original multiple matched condition, thereby allowing the user to perform several examinations of the data/address. Thus, if an error occurs during processing of multiple matches, the user can easily restart the examination process.

20 Claims, 2 Drawing Sheets

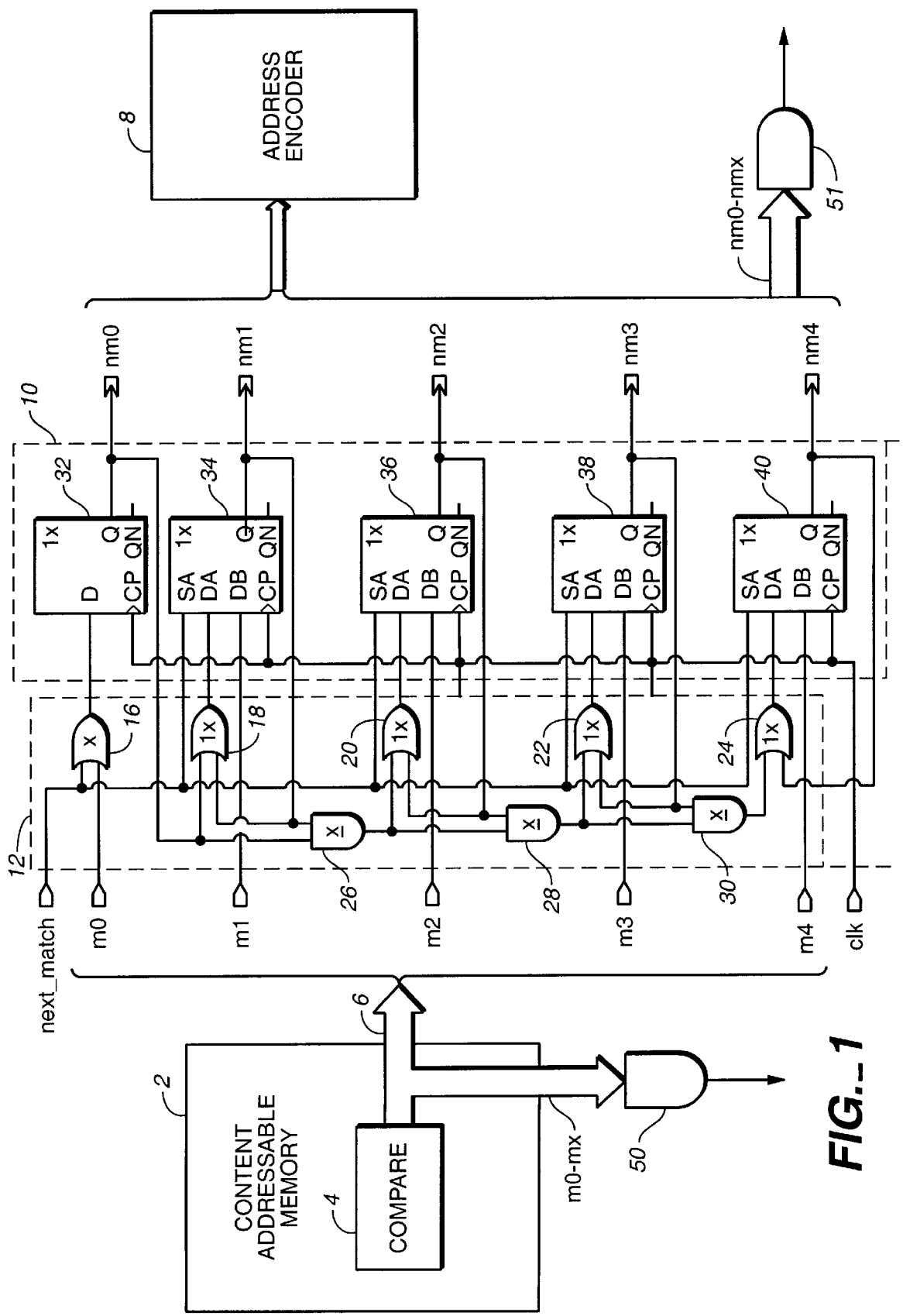
FIG._1

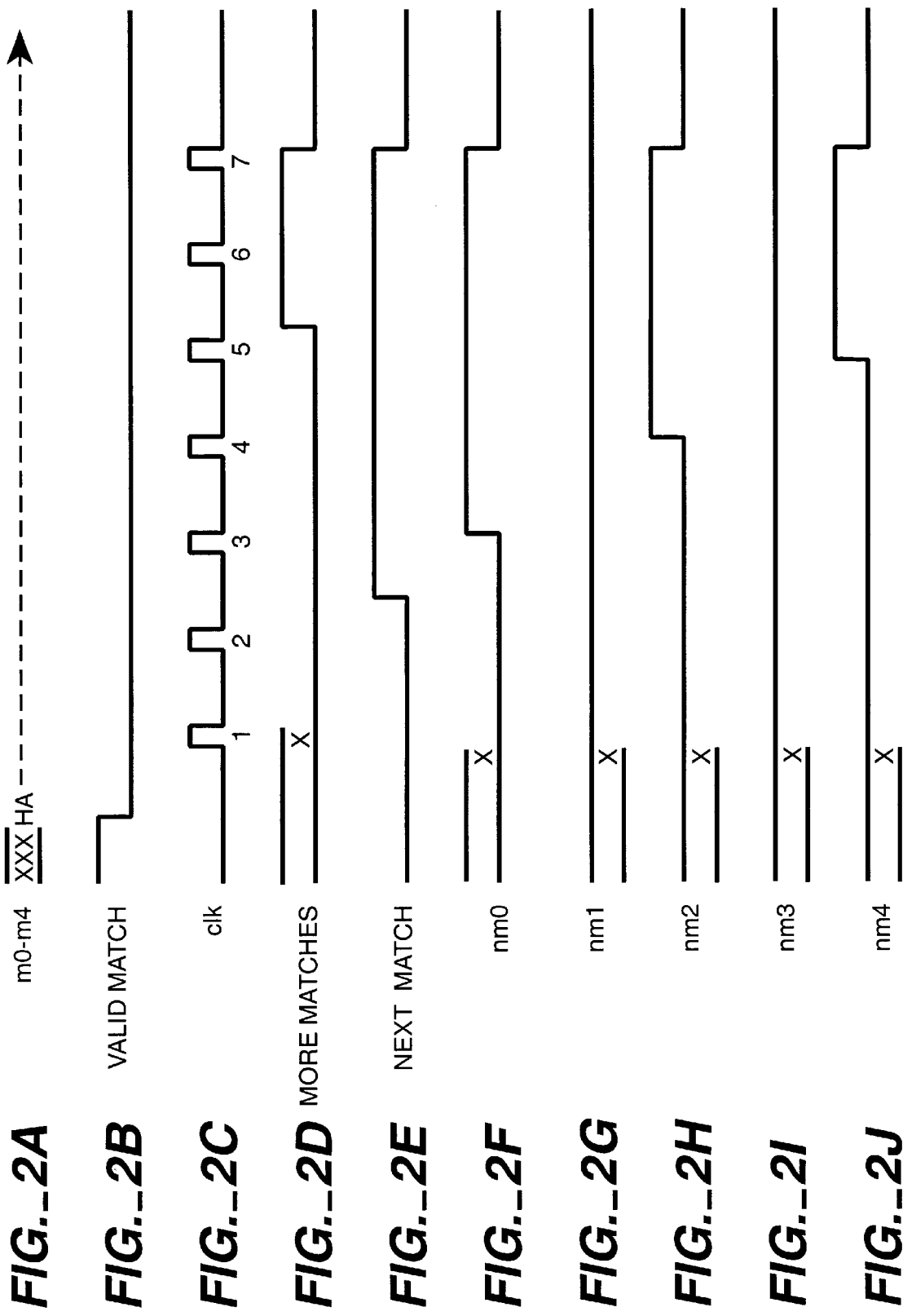

METHOD AND APPARATUS FOR READING MULTIPLE MATCHED ADDRESSES

BACKGROUND OF THE INVENTION

1. Field of the Invention

The present invention relates generally to data processing methods and systems, and more particularly, to methods and apparatus for examining multiple matched addresses associated with a storage device, such as a content addressable memory.

2. State of the Art

Presently, devices are known which are used to store data in conjunction with data processing systems. One such device is a content addressable memory (CAM), such as that described in U.S. Pat. No. 5,267,190 (Easley et al) and in U.S. Pat. No. 5,220,526 (Giles et al), the disclosures of which are hereby incorporated by reference in their entireties. As described in the '190 patent, a content addressable memory is a storage device which includes plural address registers, each of which holds a data word referred to therein as a "compare address". Further, the content addressable memory includes a write circuit which selectively loads compare addresses into the address registers. Input terminals are provided for supplying an address to be searched (i.e., "a search address") to the content addressable memory so that the search address can be compared with the compare addresses stored in the content addressable memory. To this end, compare circuits are coupled to each of the address registers and to the search address input terminals. In operation, if a search address which has been input via the search address input terminals corresponds to any of the compare addresses included in the plural address registers, a "match" signal is generated to indicate which of the address registers caused the match.

Typically, where a "match" signal is produced, it is used to address and read data stored in a separate register, such as a cache. Alternately, if no "match" signal is detected, then the content addressable memory and the cache are updated via a write operation.

Conventional content addressable memories are known which handle a situation wherein multiple matches are detected for a given search address. However, these conventional content addressable memories only identify an address of a single match (i.e., either the highest matched data/address, or the lowest matched data/address). As such, these content addressable memories do not permit the user to exploit multiple matched data/addresses to determine what, if any action should be taken. Rather, these memories are controlled in a manner which avoids the storing of multiple matched addresses therein, so that each search address corresponds to, at most, a single previously stored address of the content addressable memory.

For example, the '526 patent includes match line signals which are asserted when information to be written into a predetermined row of registers in the content addressable memory is identical to information previously stored in the content addressable memory (i.e., in another row of registers in the content addressable memory). Any asserted match line signal which was not disabled, indicates to the user when a search address is identical to a previously stored address of the content addressable memory. However, the user must activate each individual signal line (i.e., each of the "word x" lines) to determine if a match occurred for each given word address. As such, the technique for sequencing through multiple matched data/addresses is awkward and time consuming. For example, with a content addressable memory having 4,096 possible addresses, a situation where matches occurred at address locations 0 and 4,095 would be a worst case scenario. In this scenario, the user would be required to process each of the 4,096 addresses to isolate the multiple detected matches. As the size of the memory is increased, the number of addresses which must be processed will also increase.

Moreover, conventional content addressable memories which accommodate the identification of multiple matches involve the use of external logic (i.e., external to the integrated circuit on which the content addressable memory is formed). Further, processing contents of the memory can result in a modification of the memory output that can only be corrected by completely reloading the memory. For example, in the '526 patent, a match line signal associated with a predetermined row is disabled by a predetermined transistor when the row is written. As such, where an error occurs in reading and analyzing multiple matches of the memory, the entire memory must be rewritten.

Accordingly, it would be desirable to provide a storage device, such as a content addressable memory, which enables a user to individually examine and exploit the storage of multiple matches in a multiple match cycle via a simple and time efficient manner.

SUMMARY OF THE INVENTION

The present invention is directed to providing a storage device, such as a content addressable memory, which enables multiple matches to be simply and efficiently examined during a multiple match cycle, regardless of the size of the storage device. For example, where two matched entries in a content addressable memory correspond to a search address, exemplary embodiments reduce the task of examining the locations of these matches to processing only two matched addresses as opposed to having to match all entries of the content addressable memory. By providing an efficient access to multiple matched entries of a memory, the multiple matches can actually be used in an ordered manner to access different branches of a secondary memory. The use of a relatively simple control scheme enables the control logic to be implemented on a single integrated circuit chip with the memory device itself (e.g., a content addressable memory). Moreover, in contrast to conventional content addressable memories, exemplary embodiments of the present invention enable the user to reset an original multiple matched condition, thereby allowing the user to perform several examinations of the data/address. Thus, if an error occurs during processing of multiple matches, the user can easily restart the examination process.

In accordance with exemplary embodiments of the present invention, the foregoing features are achieved by an apparatus, such as a content addressable memory, which includes an addressable storage device having a plurality of addressable locations for storing data; an address encoder for selectively addressing secondary memory locations in response to outputs of said addressable storage device; and a control device for examining matches between first input data and said data stored in said storage device, said control device further comprising: means for receiving match signals which indicate a result of a comparison of said first input data to said stored data to indicate a match between said first input data and said stored data; and means for producing control signals to examine each of multiple matches which exist between said first input data and said stored data.

BRIEF DESCRIPTION OF THE DRAWINGS

Other objects and advantages of the present invention will become more apparent to those skilled in the art from a reading of the following detailed description of preferred embodiments, in conjunction with the drawings, wherein:

FIG. 1 illustrates an exemplary embodiment of a data processing system, such as a content addressable memory, configured with a control device in accordance with an exemplary embodiment of the present invention; and FIGS. 2A–2J illustrate a timing diagram for an exemplary processing of data using the FIG. 1 system.

DETAILED DESCRIPTION OF THE PREFERRED EMBODIMENTS

FIG. 1 illustrates a data processing system in accordance with an exemplary embodiment of the present invention. In FIG. 1, the data processing system can be formed on a single integrated circuit chip, and includes a content addressable memory 2 having an "n" by "m" array of addressable storage locations (e.g., cells). Further, the content addressable memory 2 includes a compare circuit 4 having a plurality of compare circuits similar to those described in the '190 patent mentioned previously, the contents of which were incorporated herein by reference. Outputs of the compare circuit 4 include a plurality of match signal paths 6. These match signal paths are labelled m0 through mx, where x=4 in FIG. 1. However, as those skilled in the art will appreciate, any number "x" of match signal paths "mx" can be included.

In addition to including an addressable storage device having plural addressable locations for storing data, the FIG. 1 data processing system further includes a conventional address encoder 8. The address encoder 8 can be configured in a manner similar to the address encoder disclosed in conjunction with the aforementioned '190 patent. The address encoder is provided to generate output addresses as n-bit addresses. That is, the address encoder includes logic which examines the match signal lines and encodes the lowest or highest match into an n bit address. The address encoder is provided for selectively addressing a plurality of addressable secondary memory locations in a secondary memory device (e.g., a cache) to perform at least one of writing data to and reading data from the cache.

In accordance with an exemplary embodiment of the present invention, the FIG. 1 data processing system further includes a control device 10 for the content addressable memory. The control device 10 provides an ability to sequentially examine each of multiple matches which may exist between first input data which has been supplied to the content addressable memory as a search address, and data stored in the content addressable memory. In an exemplary embodiment, logic of the control device enables the user to sequence through the multiple matches by sequentially changing the output control signal from control device 10 which corresponds to the lowest match.

In an exemplary embodiment, the content addressable memory control device includes a means for receiving match signals which indicate a result of a comparison of the first input data to stored data to identify any matches. In the FIG. 1 embodiment, this receiving means is represented as a logic circuit 12. The content addressable memory control device further includes a means for producing control signals to examine each of multiple matches which exist between the first input data and the stored data. In the exemplary FIG. 1 embodiment, the producing means is represented as the control device 10 which is configured as a register of flip-flops.

Generally speaking, the control device 10 receives the conventional match signal outputs produced by a conventional content addressable memory in parallel (i.e., the signals labelled m0 through m4). The control device 10 also receives at least one match control signal labelled "next match" in FIG. 1, and a clock signal labelled "clk", to produce the control signals labelled nm0 through nmx (where x=4 in FIG. 1). The control signals (i.e., control signals nm0 through nmx) are outputs of the control device 10 which are supplied to the address encoder 8 in parallel. Using the FIG. 1 embodiment, a user can selectively examine each match of the first input data to data stored in the content addressable memory during a multiple match cycle.

In the exemplary FIG. 1 embodiment, the logic circuit 12 includes OR gates 16, 18, 20, 22 and 24. Further, the logic circuit 12 includes AND gates 26, 28 and 30. The logic circuit 12 receives the match control signal labelled "next-match", the multiple match signal lines m0 through m4, and feedback from outputs of the control device 10. The logic circuit 12 supplies inputs to the flip-flops of control device 10. The flip-flops are labelled 32, 34, 36, 38 and 40, and also receive the clock signal "clk". As those skilled in the art will appreciate, the logic circuit shown in FIG. 1 is by way of example, and numerous other combinations of logic can be used to implement the functionality described herein.

Generally speaking, the clock signal is used to latch matched addresses indicated via signals m0 to m4, after new input data has been compared to stored data of the content addressable memory array. The match control signal "next-match" is initially in an exemplary logic level "low" state. The match signal lines m0 through m4 dictate whether a match has occurred for a given address location. In the FIG. 1 embodiment, the match signal lines m0 through m4 are designated active by a logic level low state. That is, when a match exists between the search address and an entry in the content addressable memory, the signal line associated with that entry (e.g., m2) is pulled to an active logic level low state.

In its initial logic level low state, the "next-match" signal enables the first match to be examined (for example, if m0 is in its active level low state, then nm0 will signal a match when the "next-match" signal is in its initial logic level low state. Multiple toggling of the clock signal line "clk" will not result in an examination of any additional matches until "next match" is toggled to a logic level high. Thus, where multiple matches exist, the "next-match" signal can be used in conjunction with the logic circuit to sequentially examine the multiple matches.

In operation, because an initial match can be examined by maintaining the "next-match" signal in its logic level low state, the first match can be examined over multiple clock cycles (provided, of course, that the inputs m0–mx do not change and the "next-match" signal remains at a logic level low). If the user wishes to selectively examine multiple matches which result from a given input of first data as a search address, the match control signal "next-match" is pulled to a logic level high state and the clock signal line "clk" is toggled. After a predetermined period of time which is a function of the content addressable memory's size, the clock signal can be toggled to latch signals on the mx lines into the control device 10.

Thus, at the first clock, the lowest (or highest) matched address can be encoded. To examine additional matches, the "next-match" control signal and the clock signal can be used.

In an exemplary embodiment, logic can be included such as an AND gate 50 having all of the mx lines as inputs, and an AND gate 51 having all of the nmx lines as inputs. The AND gate 50 can be used to determine whether the clock signal line is required to examine multiple matches. If the AND gate 50 is high, no matches were found and thus no clock is required. However, if the AND gate is low, then a clock pulse is required to latch the mx lines and examine the nmx lines.

The AND gate 51 can be used to denote (e.g., indicate to the user or to control logic) when all of the multiple matches have been examined. An output of the AND gate 51 remains low until all of the nmx matches have been examined.

If a valid match signal is generated from the mx signal lines, this signal line (which corresponds to the output of AND gate 50) will indicate that one or more matches occurred and that the clock signal line "clk" should be toggled. The use of the mx signal lines will not indicate when all of the multiple matches have been examined. However, such a feature can be achieved by generating a "more matches" signal of FIG. 2D (at clock pulse "5") using the nmx signal lines and AND gate 51, since these signal lines will inform the user when all of the matched addresses have been examined.

With reference to the exemplary timing diagram of FIG. 2, consider a situation where each of the signal lines m0, m2 and m4 have been pulled to an active logic level low state following a parallel comparison of the search address with each entry of the content addressable memory. This is generally represented by the FIG. 2A data lines transitioning from a floating value to a logic value "HA" (where HA is a hexidecimal value of 01010 for data lines m4–m0). At the time of this transition, a valid match signal line of FIG. 2B (e.g., the output of AND gate 50) can transition to a logic level low and thereby indicate that a valid match exists. By maintaining the normally low "next-match" of FIG. 2E at a logic level low, and by toggling the clock "clk" line of FIG. 2C, the lowest match line nm0 can be examined. That is, the nm0 signal causes an encoded address to be generated by the encoder 8 at the next clock pulse labelled "1" in FIG. 2C. Note that as long as the input data does not change, and the next-match signal remains at a logic level low, the initial match will be used by encoder 8 to repeatedly generate the same encoded address at each subsequent clock pulse (as represented by the second clock pulse "2" of FIG. 2C).

After next-match is toggled to a logic level high, the additional multiple matches associated with m2 and m4 can then be examined. That is, on the third clock pulse of FIG. 2C, the lowest match line nm0, which has already been examined, transitions to a logic level high. The next lowest match on signal line m2 can then be examined on the next clock pulse. This operation can be repeated until all matches have been examined. Referring to FIGS. 2C, 2H and 2J, the user can sequentially examine each of the matched signals m2 and m4 by repeatedly toggling the clock "clk" line while holding "next-match" at a logic level high. This operation can be repeated until all of the matched signal lines have been sequentially pulled to a logic level high state at the output of control logic 10.

Because output match lines of the control device 10 which have been examined are retained at a logic level high, the address encoder 8 responds to the lowest output match line from the control device 10 on each sequential examination of matched signal lines. That is, the address encoder initially responds to the lowest matched address signal on match signal line nm0. Upon subsequently setting the "next-match" signal line from its initial logic level low state to a logic level high, and toggling the clock "clk" signal line, the output nm0 is driven to the logic level high state of FIG. 2F. In this case, the address encoder 8 now responds to the lowest indicated match on output match signal line nm2. In response to further toggling of the clock "clk" signal line, the output nm2 is driven to a logic level high state so that the lowest indicated match now appears on the output match signal line nm4.

If the user wishes to reexamine the lowest matched address, this can be accomplished by resetting the match control signal "next-match" to a logic level low state, and by toggling the clock signal line "clk" (provided the original input data "HA" remains unchanged (or has been stored in an input register of the FIG. 1 device), as represented at clock pulse "7" in FIG. 2.

Note that for the example given above, logic level high signals on input match signal lines m1 and m3 indicate an absence of matches and produce logic level high signals at outputs nm1 and nm3 of FIGS. 2G and 2I (i.e., m1 and m3 are clocked into the "DB" inputs of the flip-flops 34 and 38).

The control device 10 of the exemplary FIG. 1 embodiment supplies the normally low match control signal "next-match" to a D-input of flip-flop 32 via OR gate 16. The match control signal "next-match" is also supplied directly to the set input "SA" of each of the flip-flops 34, 36, 38 and 40. OR gate 16 receives the match signal m0 at its second input. To provide the ability to sequentially access through the match signal lines, the second flip-flop 34 receives a first D-input "DA" via OR gate 18. The OR gate 18 receives the nm0 signal and the nm1 signal at its inputs. The flip-flop 34 also receives the match signal line m1 at its second D-input "DB". Thus, for the example described above where the match signal line m1 is at a logic level high state (i.e., because no match was detected at the location of the content addressable memory corresponding to signal line m1), a logic level high state is produced on the output nm1 in response to the first toggling of the clock signal "clk".

Again, to provide the sequential ability to examine the match signal lines, the outputs nm0 and nm1 are supplied via AND gate 26 to an OR gate 20 which receives the output nm2 at its second input. An input of OR gate 20 is supplied to the first D-input "DA" of flip-flop 36. The second match signal line m2 is supplied to the second D-input "DB" of flip-flop 36. Because the output nm1 was set to a logic level high condition in response to the first toggling of the clock signal "clk", the output of AND gate 26 is set high in response to this first toggling of the clock. As such, upon a subsequent toggling of the clock, the output nm2 will be driven to an active logic level high state to render the output nm4 the lowest match signal line (i.e., recall that because the match signal line m3 was at a logic level high condition, the output nm3 will already be a logic level high in response to the second toggling of the clock signal "clk").

The logic configuration associated with the flip-flop 36 can be repeated any number of times to accommodate the number of match signal lines. For example, the flip-flop 38 receives inputs via AND gate 28 OR gate 22 and match signal line m3. The flip-flop 40 receives inputs via AND gate 30, OR gate 24 and match signal line m4. All of the flip-flops receive the clock signal "clk" at a clock input labelled "CP".

Those skilled in the art will appreciate that while the above exemplary embodiment has been described in the context of a next-match signal, match signal lines and control signals which are active low, active high signals can also be used, as can any combination of active high and active low signals. Further, exemplary embodiments of the present invention are not limited to the exact configuration of logic and registers described above, but can be used in conjunction with any logic which provides the functionality described herein. For example, rather than using the daisy chain logic of the logic circuit 12, those skilled in the art will appreciate that a look-ahead logic circuit can be configured. Look-ahead logic is well known in the art, and can be used to improve operating frequency during examination of multiple matches when a depth of the content addressable memory increases.

Further, those skilled in the art will appreciate that although an exemplary embodiment has been described herein with respect to a content addressable memory, other applications will be readily apparent. For example, exemplary embodiments of the present invention can also be used to process interrupt requests of an interrupt processor, in which all of the requests must be processed prior to the processing of any new requests.

As those skilled in the art will also appreciate, an ability to directly access only those match signal lines wherein matches were indicated allows a significant reduction in the processing time associated with identifying and exploiting the use of multiple matches. In the exemplary FIG. 1 embodiment, such sequential accessing of matched signals is achieved using the two control signals next-match and the clock signal "clk". However, those skilled in the art will appreciate that additional control signals can be included to enhance the functionality of the exemplary FIG. 1 embodiment.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An apparatus comprising:
   an addressable storage device having a plurality of addressable locations for storing data;
   an address encoder for selectively addressing secondary memory locations in response to outputs of said addressable storage device; and
   a control device for examining matches between first input data and said data stored in said storage device, said control device further comprising:
      means for receiving match signals which indicate a result of a comparison of said first input data to said stored data to indicate a match between said first input data and said stored data; and
      means for producing control signals to examine each of multiple matches which exist between said first input data and said stored data.

2. Apparatus according to claim 1, wherein said receiving means further includes:
   a logic circuit for receiving said match signals and for receiving at least one match control signal.

3. Apparatus according to claim 2, wherein said match control signal is a user control signal for sequencing said content addressable memory among each of said multiple matches.

4. Apparatus according to claim 3, wherein said match control signal is an active low logic signal used to sequence said content addressable memory.

5. Apparatus according to claim 2, wherein said logic circuit further includes:
   at least one logic gate for receiving at least one of said match signals and for receiving said at least one control signal.

6. Apparatus according to claim 5, wherein said at least one logic gate is an OR gate.

7. Apparatus according to claim 1, wherein said producing means further includes:
   at least one additional storage device for receiving an output of said receiving means and for receiving a clock signal.

8. Apparatus according to claim 7, wherein said at least one additional storage device is a flip-flop.

9. Apparatus according to claim 3, wherein said producing means further includes:
   at least one additional storage device for receiving an output of said receiving means and for receiving a clock signal.

10. Apparatus according to claim 9, wherein said producing means sequentially outputs said control signals when logic states of said at least one match control signal and said clock signal have a predetermined relationship.

11. Apparatus according to claim 10, wherein each of said sequential control signals is sequentially produced in response to said match control signal being active low and said clock signal being toggled.

12. Apparatus according to claim 10, wherein said producing means further includes a plurality of flip-flops, and said receiving means further includes at least one logic gate for receiving outputs from at least two of said plurality of flip-flops.

13. Apparatus according to claim 12, wherein said receiving means further includes:
   at least one additional logic gate for receiving at least one of said match signals and for receiving at least one control signal for sequencing among said multiple matches.

14. Apparatus according to claim 13, wherein an output of said at least one logic gate is input to at least one of said plurality of flip-flops.

15. Apparatus according to claim 14, wherein said at least one match control signal is supplied to each of said plurality of flip-flops.

16. A memory control device comprising:
   means for receiving match signals which indicate a result of a comparison of first input data to stored data of said memory to indicate a match between said first input data and said stored data; and
   means for producing control signals to sequentially examine each of multiple matches which exist between said first input data and said stored data.

17. Apparatus according to claim 16, wherein said receiving means further includes:
   a logic circuit for receiving said match signals and for receiving at least one match control signal.

18. Apparatus according to claim 17, wherein said match control signal is a user control signal for sequencing said memory among each of said multiple matches.

19. Apparatus according to claim 17, wherein said producing means further includes:
   at least one additional storage device for receiving an output of said receiving means and for receiving a clock signal.

20. A method for controlling a content addressable memory comprising the steps of:
   receiving match signals which indicate a result of a comparison of first input data to stored data of the content addressable memory to indicate a match between said first input data and said stored data; and
   producing sequential control signals to examine each of multiple matches which exist between said first input data and said stored data.

* * * * *